(12) United States Patent
Lin et al.

(10) Patent No.: US 11,088,067 B2
(45) Date of Patent: *Aug. 10, 2021

(54) SEMICONDUCTOR DEVICE AND LAYOUT DESIGN THEREOF

(71) Applicant: Taiwan Semiconductor Manufacturing Co., Ltd., Hsinchu (TW)

(72) Inventors: Chung-Te Lin, Tainan (TW); Ting-Wei Chiang, New Taipei (TW); Hui-Zhong Zhuang, Kaohsiung (TW); Li-Chun Tien, Tainan (TW); Pin-Dai Sue, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/913,697

(22) Filed: Jun. 26, 2020

(65) Prior Publication Data

US 2020/0328148 A1 Oct. 15, 2020

Related U.S. Application Data

(63) Continuation of application No. 16/174,953, filed on Oct. 30, 2018, now Pat. No. 10,727,177, which is a continuation of application No. 15/135,493, filed on Apr. 21, 2016, now Pat. No. 10,141,256.

(51) Int. Cl.
*H01L 23/522* (2006.01)
*H01L 27/118* (2006.01)
*H01L 27/02* (2006.01)

(52) U.S. Cl.
CPC ...... *H01L 23/5222* (2013.01); *H01L 23/5226* (2013.01); *H01L 27/0207* (2013.01); *H01L 27/11807* (2013.01)

(58) Field of Classification Search
CPC ............ H01L 23/5222; H01L 23/5226; H01L 27/0207; H01L 27/11807
See application file for complete search history.

(56) References Cited

U.S. PATENT DOCUMENTS

| 9,209,177 B2 | 12/2015 | Kim et al. |
| 9,331,173 B2 | 5/2016 | Liu et al. |
| 2006/0091498 A1 | 5/2006 | Sriram et al. |
| 2007/0057340 A1 | 3/2007 | Jung |
| 2011/0147765 A1 | 6/2011 | Huang et al. |
| 2014/0332883 A1* | 11/2014 | Kwon ................ H01L 27/0266 257/336 |
| 2015/0235948 A1 | 8/2015 | Song et al. |
| 2016/0005851 A1 | 1/2016 | Song et al. |

(Continued)

FOREIGN PATENT DOCUMENTS

| KR | 1020070068374 A | 6/2007 |
| KR | 1020140132179 A | 11/2014 |

(Continued)

*Primary Examiner* — Christine A Enad
(74) *Attorney, Agent, or Firm* — Slater Matsil, LLP (57) ABSTRACT

A device includes gates and a first conductive segment. A first distance is present between a first gate of the gates and the first conductive segment. A second distance is present between a second gate of the gates and the first conductive segment. The first distance is greater than the second distance.

20 Claims, 7 Drawing Sheets

(56) References Cited

U.S. PATENT DOCUMENTS

| | | | |
|---|---|---|---|
| 2016/0118496 A1 | 4/2016 | Anderson et al. | |
| 2016/0284707 A1* | 9/2016 | Okagaki | H01L 29/0657 |
| 2016/0307837 A1 | 10/2016 | Park et al. | |
| 2016/0336240 A1* | 11/2016 | Olligs | H01J 37/28 |
| 2017/0141211 A1 | 5/2017 | Xie et al. | |

FOREIGN PATENT DOCUMENTS

| | | |
|---|---|---|
| TW | 201423907 A | 6/2014 |
| TW | 201431091 A | 8/2014 |

\* cited by examiner

SEMICONDUCTOR DEVICE AND LAYOUT DESIGN THEREOF

PRIORITY CLAIM AND CROSS-REFERENCE

This application is a continuation of U.S. patent application Ser. No. 16/174,953, filed on Oct. 30, 2018, which is a continuation of U.S. patent application Ser. No. 15/135,493, filed on Apr. 21, 2016, and entitled "Semiconductor Device and Layout Design Thereof," now U.S. Pat. No. 10,141,256 issued on Nov. 27, 2018, which applications are incorporated herein by reference in their entireties.

BACKGROUND

In manufacturing process technology, the material density requirement becomes imperative due to yield and reliability concerns. For example, if either the metal or via density is not sufficient, the low-k material popularly used in advanced integrated circuits is not robust to Chemical-Mechanical Polishing (CMP) process during manufacturing. Thus, a technique of inserting dummy layers is developed to increase the material density, in order to improve the yield rate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Figure 1:
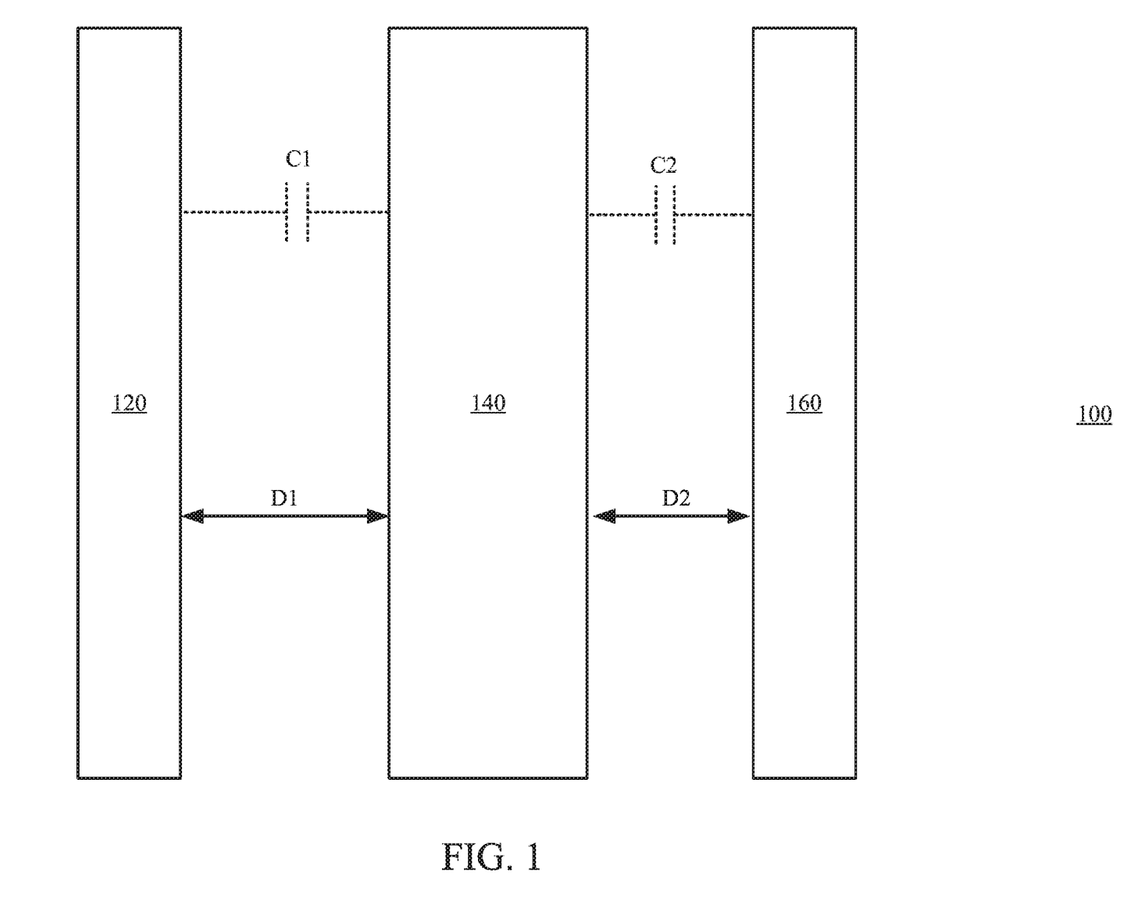
FIG. 1 is a top view of a schematic layout of a semiconductor structure, in accordance with various embodiments of the present disclosure.

Reference is now made to FIG. 1. FIG. 1 is a top view of a schematic layout of a semiconductor structure 100, in accordance with various embodiments of the present disclosure. In some embodiments, at least a portion of the semiconductor structure 100 and semiconductor structures as will be discussed with reference to FIGS. 2B-2E, represents a standard cell. The standard cell, in some embodiments, refers to a pre-designed cell that has been laid out and stored in a circuit library that is in a form of a database. Moreover, the standard cell, in some embodiments, is stored in a tangible storage medium, including, for example, a hard drive. In the design of integrated circuits, the standard cell is retrieved from the circuit library, and is placed in a placement operation. The placement operation is performed, for example, using a computer, which runs the software for designing integrated circuits. The software includes a circuit layout tool, which has a function of placement and routing.

In some embodiments, the semiconductor structure 100 of FIG. 1, or one of the semiconductor structures of FIGS. 2B-2E, which will be illustrated in detail below, is implemented in a semiconductor device. In some other embodiments, the semiconductor structure 100 of FIG. 1, or one of the semiconductor structures of FIGS. 2B-2E, which will be illustrated in detail below, is used to form transistors including, for example, Fin Field-Effect Transistor (FinFET), planar transistor, or the like. For illustration, the semiconductor structure 100 includes an N-type metal-oxide-semiconductor (NMOS) transistor or a P-type metal-oxide-semiconductor (PMOS) transistor. One of ordinary skill in the art will appreciate that the above examples are given for illustrative purposes. Various devices implemented by the semiconductor structures in the present disclosure are within the contemplated scope of the present disclosure.

As illustratively shown in FIG. 1, the semiconductor structure 100 includes a pattern 120, a pattern 140, and a pattern 160. The pattern 140 is disposed between the pattern 120 and the pattern 160. In some embodiments, the term "pattern" is also referred to as a semiconductor configuration formed with various semiconductor materials.

In some embodiments, the patterns 120, 140 and 160 are disposed over an active region (also referred to as "OD" in some embodiments), which, for simplicity of illustration, is not shown in FIG. 1. The active region is formed over a semiconductor substrate (not shown) in some embodiments.

In some embodiments, the pattern 120 and the pattern 160 are arranged as gates in at least one semiconductor device. The gates are formed of polysilicon in some embodiments. The term "gate" discussed in the present disclosure is also referred to as "PO" in some embodiments. Various conductive materials used to form the gates are within the contemplated scope of the present disclosure. For example, in various embodiments, the gates are formed of metals, metal alloys, metal silicides, or the like.

In various embodiments, the pattern 160 is arranged as a dummy gate. The dummy gate does not act as a gate to any semiconductor device including, for example, transistor. In such embodiments, the dummy gate is disposed over, and cover, an edge of the active region as discussed above. The dummy gate is also referred to as "PODE (poly on OD edge)" in some embodiments.

In some embodiments, the pattern 160 is arranged as a duplicate of the pattern 120. In some embodiments, the duplicate is configured to be prohibited from processing electrical signals generated and/or received by a circuit. For illustration, the pattern 160 is floating, or to receive a fixed voltage including, for example, a system voltage, a ground voltage, etc. In some embodiments, the pattern 160 is inserted, for example, by a place and route (P&R) tool, to the semiconductor structure 100 according to design rules of the manufacturing technology.

In some embodiments, the pattern 140 is arranged as a conductive metal segment, which, for illustration, is a contact, in at least one semiconductor device. For illustration, the pattern 140 is arranged as a source/drain contact in a MOS device in some embodiments. In some embodiments, the term "conductive metal segment" discussed in the present disclosure is also referred to as "MD."

In some embodiments, the patterns 120, 140 and 160 are formed in a same layer over the active region as discussed above. In some embodiments, the height of each one of the patterns 120 and 160 is different from the height of the pattern 140. In various embodiments, the height of the pattern 140 is greater than the height of each one of the patterns 120 and 160.

In some embodiments, with a coupling effect, the patterns 120 and 140 are configured to have a capacitance C1 therebetween, and the patterns 140 and 160 are configured to have a capacitance C2 therebetween. In some embodiments, the value of the capacitance C1 is different from the value of the capacitance C2. For example, the value of the capacitance C1 is less than the value of the capacitance C2 in some embodiments.

For illustration in FIG. 1, a distance D1 is present between the patterns 120 and 140, and a distance D2 is present between the patterns 140 and 160. In some embodiments, when the distance D1 increases, the value of the capacitance C1 decreases, and vice versa. In some embodiments, when the distance D2 decreases, the value of the capacitance C2 increases, and vice versa.

In some embodiments, the minimum of the distance D2 is set according to requirements of the design rule defined in the circuit layout tool as discussed above. For example, in some embodiments, the minimum of the distance D2 is in a range from about 0 to about 20 nano-meters. The minimum value of the distance D2 discussed above is given for illustrative purposes only. Various minimum values of the distance D2 are within the contemplated scope of the present disclosure.

The terms "about" is applied to modify any quantitative representation which could permissibly vary without resulting in a change in the basic function to which it is related. In some embodiments, as used herein, "about" shall generally mean within 20 percent of a given value or range. In some other embodiments, "about" shall generally within 10 percent of a given value or range. In some further embodiments, "about" shall generally within 5 percent of a given value or range.

As described above, in some embodiments, the pattern 120 is arranged as the gate in at least one semiconductor device, and the pattern 160 is arranged as the dummy gate in at least one semiconductor device. Accordingly, the pattern 120 is utilized to process at least one electrical signal (not shown in FIG. 1) in some embodiments. In some situations, the capacitance C1 would introduce certain timing impacts, which include, for example, unnecessary time delay, etc., on the processed signal. With the arrangements of reducing the values of the capacitance C1, the timing impacts on the processed signal, which are introduced by the capacitance C1, are reduced. Embodiments of the arrangements of reducing the values of the capacitance C1 are discussed below with reference to FIGS. 2A-2E and FIG. 3.

As discussed above, the pattern 160 is arranged as the dummy gate, and processes no electrical signals, in some embodiments. Accordingly, the variation of the capacitance C2 does not affect the performance of the circuit utilizing the semiconductor structure 100.

For ease of understanding, embodiments of semiconductor devices, including, for example, a MOS device employing the semiconductor structure like the semiconductor structure 100 in FIG. 1, are illustrated below with reference to FIGS. 2A-2E. However, the present disclosure is not limited to the following embodiments. Various types of semiconductor devices, circuits, and/or ICs employing the semiconductor structure 100 in FIG. 1 and the semiconductor structures in FIGS. 2A-2E are within the contemplated scope of the present disclosure.

Figure 2A:
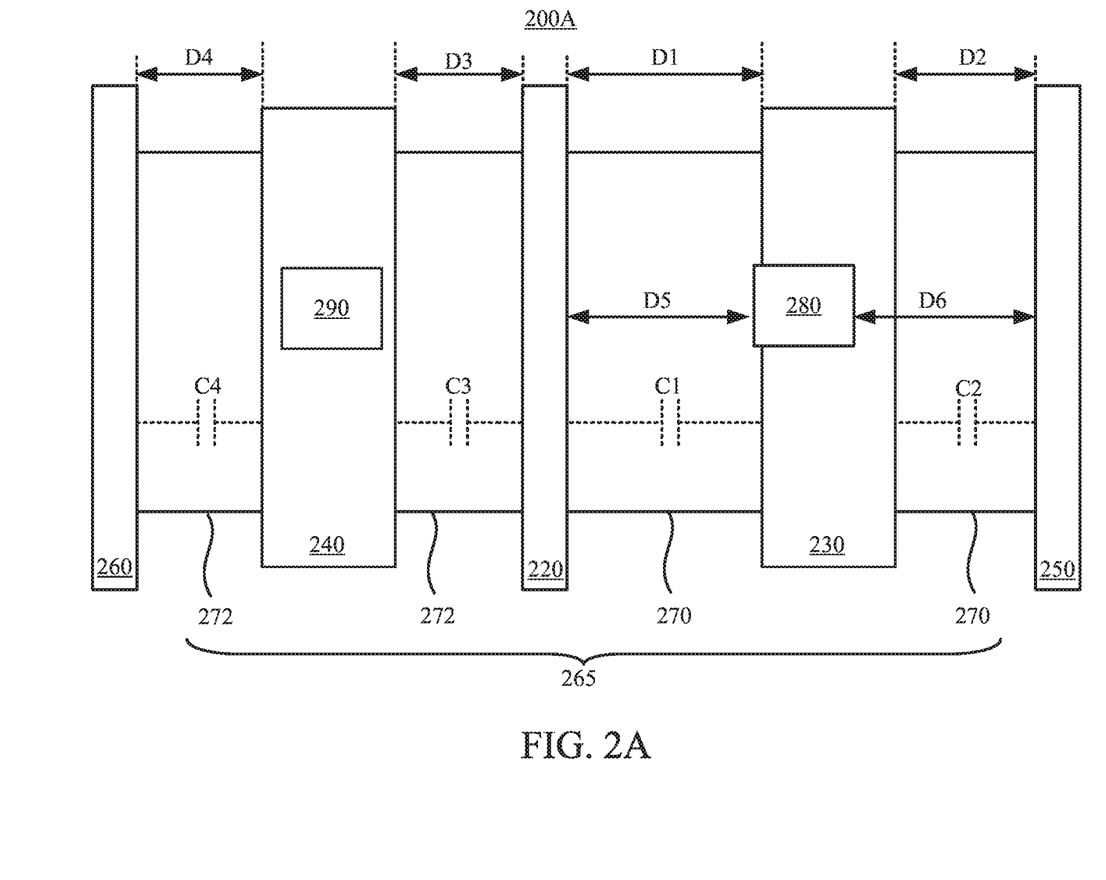
FIG. 2A is a top view of a schematic layout of a MOS device, in accordance with some embodiments of the present disclosure.

Reference is now made to FIG. 2A. FIG. 2A is a top view of a schematic layout of a MOS device 200A in accordance with some embodiments of the present disclosure. In some embodiments, the MOS device 200A employs a semiconductor structure like the semiconductor structure 100 as discussed in FIG. 1. As illustratively shown in FIG. 2A, the MOS device 200A includes a gate 220, a contact 230, a contact 240, a dummy gate 250, a dummy gate 260, an OD region 265 including active regions 270 and 272, a via 280, and a via 290. For illustration, the gate 220, the dummy gate 250 and the contact 230 are arranged respectively corresponding to the pattern 120, the pattern 160 and the pattern 140 of the semiconductor structure 100 in FIG. 1.

For illustration in FIG. 2A, the gate 220, the dummy gate 250 and the contact 230 are disposed over the OD region 265. The via 280 is disposed over the contact 230. In some embodiments, the contact 230 is coupled between the via 280 and the active region 270. The dummy gate 250 covers an edge of the OD region 265, and is also referred to as "PODE" in some embodiments.

In some embodiments, the gate 220 is configured to receive a first signal (not shown in FIG. 2A) for turn-on or turn-off of the MOS device 200A. In some embodiments, the active region 270 corresponds to a first source/drain region of the MOS device 200A, and the active region 272 corresponds to a second source/drain region of the MOS device 200A.

In some embodiments, the contact 230 and the contact 240 are implemented with conductive segments. In some embodiments, the contact 230 is configured to transmit and/or output a second signal (not shown in FIG. 2A) in response to the first signal received by the gate 220. For illustration, the second signal indicates a current flowing from the first source/drain region to the second source/drain region of the MOS device 200A. In some other embodiments, the via 280 is configured to couple the contact 230 with other metal layers (not shown), in order to transmit the second signal from the contact 230 to other circuits (not shown).

For further illustration in FIG. 2A, the contact 240 is arranged corresponding to the contact 230 with respect to the gate 220. In some embodiments, the contact 240 is configured to transmit and/or output a third signal (not shown in FIG. 2A) in response to the first signal received by the gate 220. For illustration, the third signal indicates a current flowing through the second source/drain region of the MOS device 200A. In some embodiments, the contact 240 is coupled between the via 290 and the active region 272. In some other embodiments, the via 290 is configured to couple the contact 240 with other metal layers (not shown), in order to transmit the third signal from the contact 240 to other circuits (not shown).

For further illustration in FIG. 2A, the dummy gate 260 is arranged corresponding to the dummy gate 250 with respect to the gate 220. The dummy gate 260 covers the other edge of the OD region 265, and is also referred to as "PODE" in some embodiments. In some embodiments, the dummy gate 250 and the dummy gate 260 are configured to process no electrical signals.

Moreover, as illustratively shown in FIG. 2A, a distance D1 is present between the gate 220 and the contact 230, and a distance D2 is present between the dummy gate 250 and the contact 230. A distance D3 is present between the gate 220 and the contact 240, and a distance D4 is present between the dummy gate 260 and the contact 240.

In some embodiments, with the coupling effect, a capacitance C1 is formed between the gate 220 and the contact 230, and a capacitance C2 is formed between the dummy gate 250 and the contact 230. A capacitance C3 is formed between the gate 220 and the contact 240, and a capacitance C4 is formed between the dummy gate 260 and the contact 240. In some embodiments, the distance D1 is different from the distance D2. For illustration of the embodiments of FIG. 2A, the distance D1 is greater than the distance D2, and the distance D3 is the same as the distance D4.

In some approaches, the distance D1 is set to be equal to the distance D2, and the distance D3 is set to be equal to the distance D4. In other words, in such approaches, the spacings for forming the capacitances C1-C2, or the capacitances C3-C4, are symmetrical. Compared with the aforementioned approaches, the spacings for forming the capacitances C1 and C2 in FIG. 2A are asymmetric. With the arrangements illustrated in FIG. 2A, the capacitance C1, coupling between the gate 220 and the contact 230, is reduced, while the distance D1 increases, as discussed above. Thus, compared with the aforementioned approaches, the timing impacts on the first signal received by the gate 220, and the second signal from the contact 230, are reduced. As a result, the performance of the MOS device 200A is improved.

In some embodiments, as shown in FIG. 2A, the via 280 is arranged at a middle location between the gate 220 and the dummy gate 250. For illustration of FIG. 2A, a distance D5 is present between the gate 220 and the via 280, and a distance D6 is present between the dummy gate 250 and the via 280. The distance D5 is about the same as the distance D6. Based on the above arrangements of the contact 230 and the via 280, the contact 230 is arranged with offset with respect to the via 280, as illustrated in FIG. 2A. In other words, as shown in FIG. 2A, at least one portion of the via 280 is not arranged upon the contact 280.

In some embodiments, the distance D3 is about the same as the distance D4, and the via 290 is disposed at a middle location between the gate 220 and the dummy gate 260. Based on the above arrangements of the contact 240 and the via 290, the contact 240 is arranged without offset with respect to the via 290, as illustrated in FIG. 2A. In other words, the entire via 290 is arranged upon the contact 240.

Figure 2B:
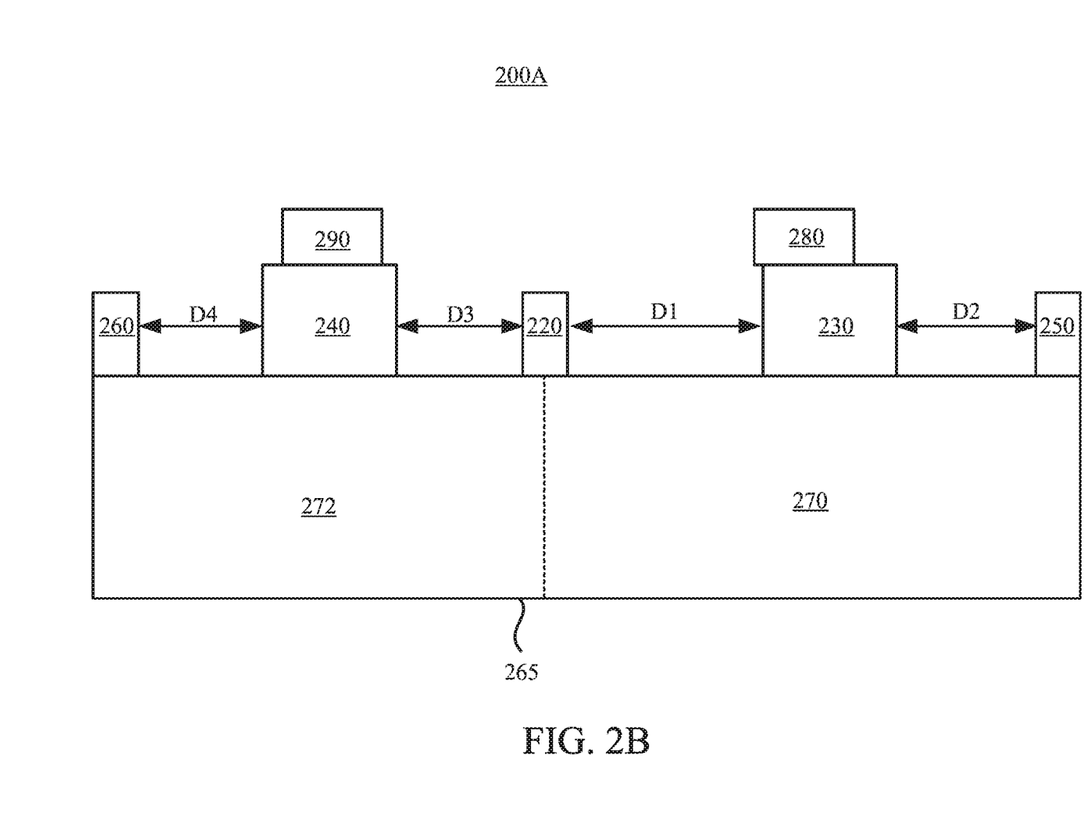
FIG. 2B is a side view of the MOS device in FIG. 2A, in accordance with some embodiments of the present disclosure.

Reference is now made to FIG. 2B. FIG. 2B is a side view of the MOS device 200A in FIG. 2A, in accordance with some embodiments of the present disclosure. With respect to FIG. 2A, like elements in FIG. 2B are designated with the same reference number for ease of understanding.

In some embodiments, the MOS device 200A in FIG. 2B further includes a substrate (not shown). The gate 220, the contacts 230 and 240, the dummy gates 250 and 260, the active regions 270 and 272, and the vias 280 and 290 are arranged above the substrate. In some embodiments, the active regions 270 and 272 are formed on the substrate through a diffusion process. In some other embodiments, the active regions 270 and 272 are formed on the substrate through an ion implantation process. The formation of the active regions 270 and 272 are given for illustrative purposes. Various processes for forming the active regions 270 and 272 are within the contemplated scope of the present disclosure. In some embodiments, the substrate is made of a semiconductor material, including, for example, silicon, silicon carbide (SiC), silicon germanium (SiGe), or III-V compound semiconductor material. The above implementations of the substrate are given for illustrative purposes. Various implementations of the substrate are within the contemplated scoped of the present disclosure.

Figure 2C:
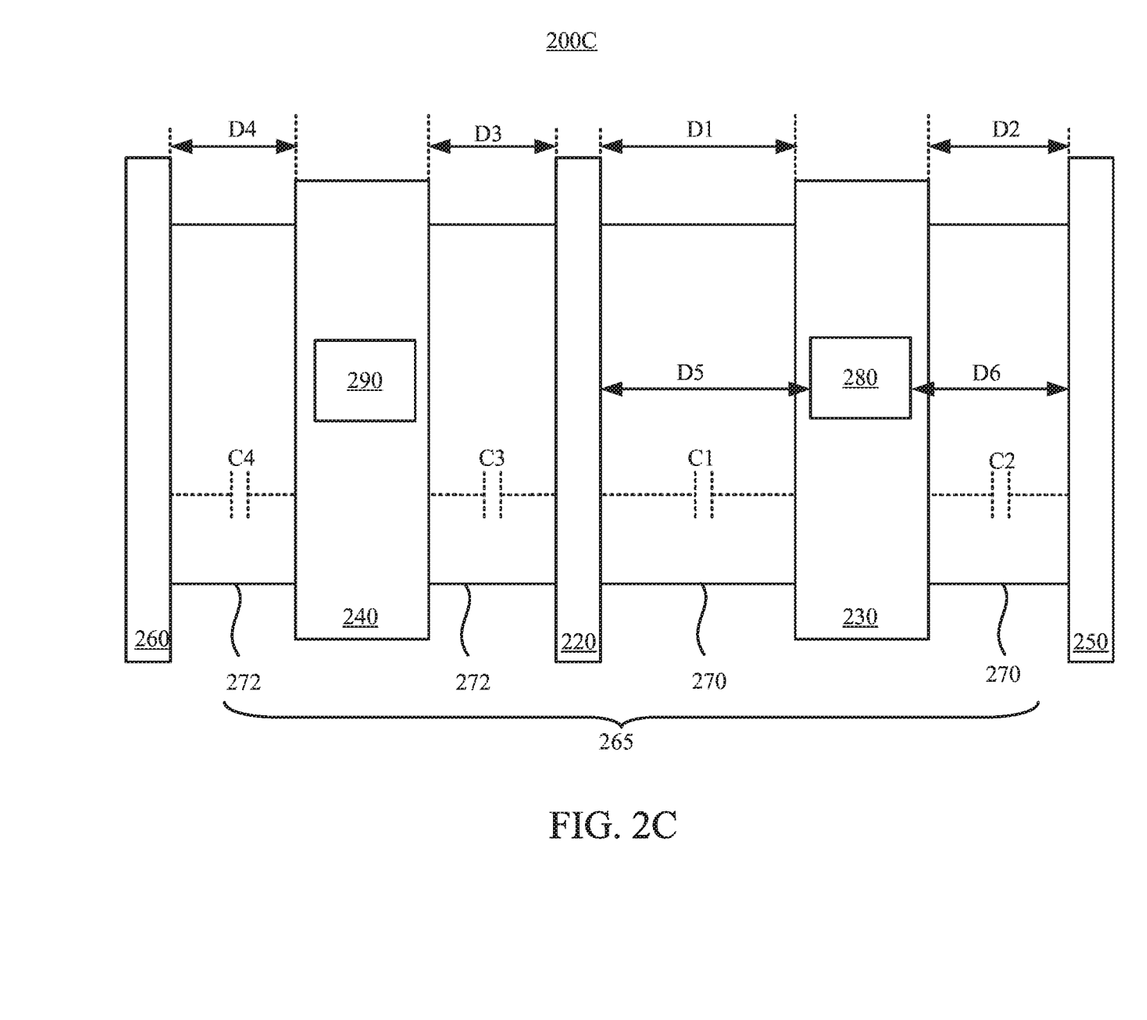
FIG. 2C is a top view of a schematic layout of a MOS device, in accordance with some other embodiments of the present disclosure.

Reference is now made to FIG. 2C. FIG. 2C is a top view of a schematic layout of a MOS device 200C in accordance with some other embodiments of the present disclosure. For illustration in FIG. 2C, the MOS device 200C includes like elements corresponding to those in FIG. 2A. With respect to the embodiments of FIG. 2A, like elements in FIG. 2C are designated with the same reference numbers for ease of understanding.

The arrangements of the via 280 and the via 290 in FIG. 2A are given for illustrative purposes. Various arrangements of the via 280 and the via 290 are within the contemplated scope of the present disclosure. For example, compared with FIG. 2A, the distance D5 in FIG. 2C is greater than the distance D6 in FIG. 2C. Based on the above arrangements of the contact 230 and the via 280, the contact 230 is arranged without offset with respect to the via 280, as illustrated in FIG. 2C. In other words, the entire via 280 is arranged upon the contact 230. The arrangements of the via 290 in FIG. 2C are similar with the via 290 in FIG. 2B, and thus the repetitious description is not given here.

Figure 2D:
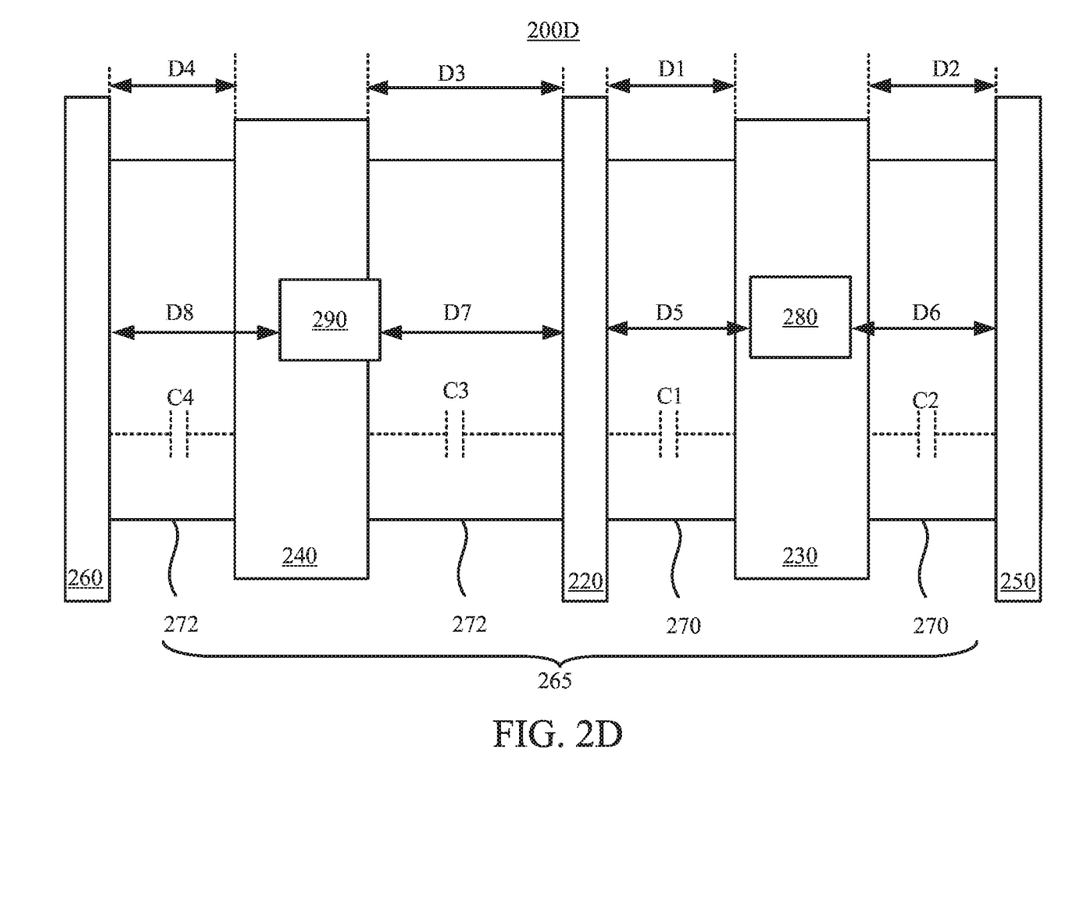
FIG. 2D is a top view of a MOS device, in accordance with some other embodiments of the present disclosure.

Reference is now made to FIG. 2D. FIG. 2D is a top view of the MOS device 200D, in accordance with some other embodiments of the present disclosure. With respect to the embodiments of FIG. 2A, like elements in FIG. 2D are designated with the same reference numbers for ease of understanding.

Compared with FIG. 2A, in the embodiments of FIG. 2D, the gate 220, the dummy gate 260 and the contact 240 are arranged respectively corresponding to the pattern 120, the pattern 160 and the pattern 140 of the semiconductor structure 100 in FIG. 1. For illustration, the distance D1 is about the same as the distance D2, and the distance D3 is greater than the distance D4. In other words, the spacing for forming the capacitance C3, coupling between the gate 220 and the contact 240, is reduced. As a result, compared with the aforementioned approaches, the timing impacts on the first signal, which is received and/or transmitted through the gate 220, and the third signal, which is generated and/or transmitted through the contact 240, are reduced.

In some embodiments of FIG. 2D, the via 280 is arranged at a middle location between the gate 220 and the dummy gate 250. Alternatively stated, the distance D5 is about the same as the distance D6. Based on the above arrangements of the contact 230 and the via 280, the contact 230 is arranged without offset with respect to the via 280, as illustrated in FIG. 2D. In other words, as shown in FIG. 2D, the entire via 280 is arranged upon the contact 280.

In some embodiments of FIG. 2D, the via 290 is arranged at a middle location between the gate 220 and the dummy gate 260. In other words, a distance D7 between the via 290 and the gate 220 is about the same as a distance D8 between the via 290 and the dummy gate 260. Based on the above arrangements of the contact 240 and the via 290, the contact 240 is arranged with offset with respect to the via 290, as illustrated in FIG. 2D. In other words, as shown in FIG. 2D, at least one portion of the via 290 is not arranged upon the contact 240.

In some other embodiments of FIG. 2D, the distance D7 between the via 290 and the gate 220 is greater than the distance D8 between the via 290 and the dummy gate 260. Based on the above arrangements of the contact 240 and the via 290, the contact 240 is arranged without offset with respect to the via 290.

Figure 2E:
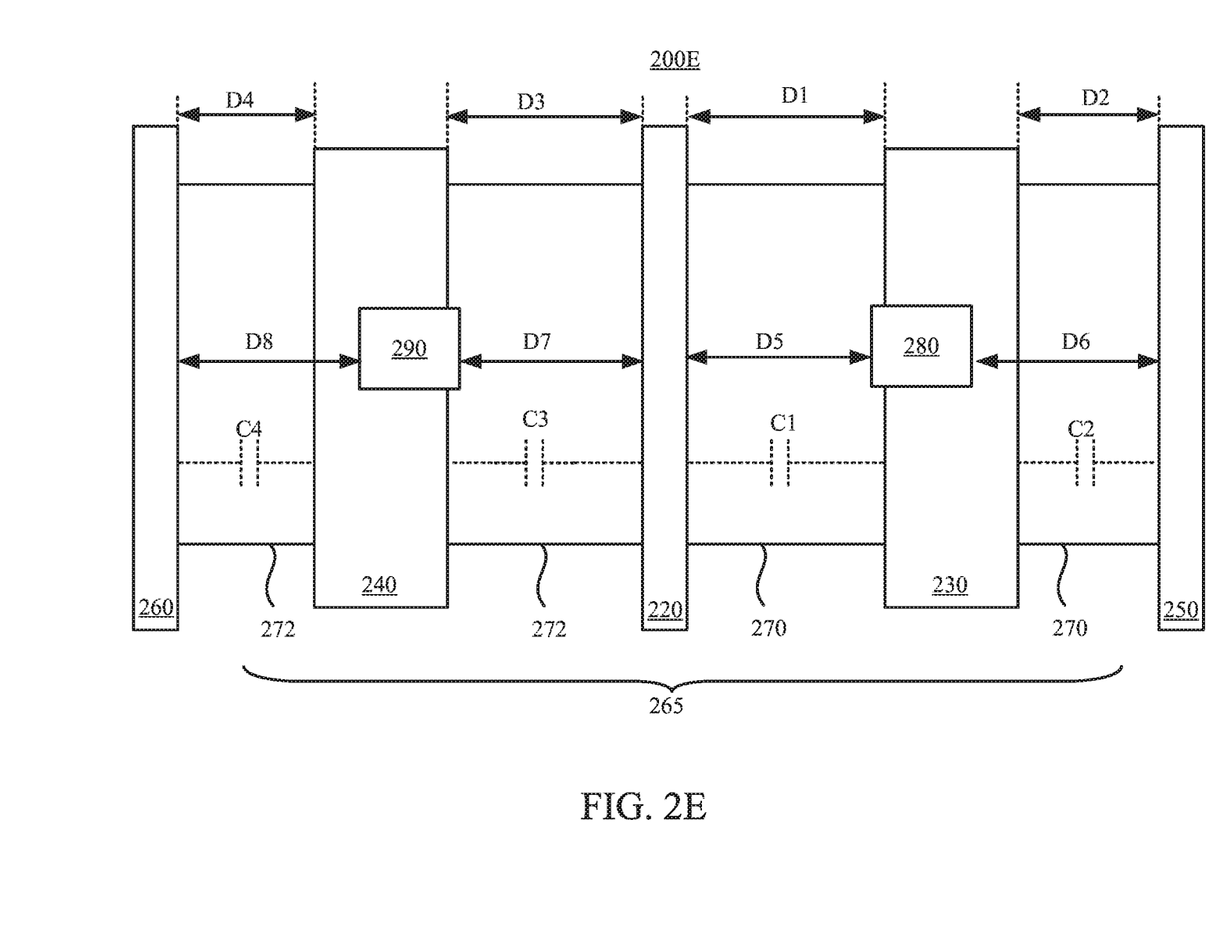
FIG. 2E is a top view of a MOS device, in accordance with some other embodiments of the present disclosure.

Reference is now made to FIG. 2E. FIG. 2E is a top view of the MOS device 200E, in accordance with some other embodiments of the present disclosure. With respect to the embodiments of FIG. 2A, like elements in FIG. 2E are designated with the same reference numbers for ease of understanding.

Compared with FIG. 2C, in the embodiments of FIG. 2E, the distance D1 is configured to be greater than the distance D2, and the distance D3 is configured to be greater than the distance D4. Accordingly, the spacings for forming the capacitances C1 and the capacitance C2 are asymmetric, and the spacings for forming the capacitance C3 and the capacitance C4 are asymmetric. Accordingly, the capacitance C1, coupling between the gate 220 and the contact 230, and the capacitance C3, coupling between the gate 220 and the contact 240 are able to be reduced. Thus, the timing impacts on the first signal, the second signal, and the third signal, which are processed and/or transmitted through the gate 220, the contact 230, and contact 240, respectively, are reduced. As a result, the performance of the MOS device 200E is further improved.

In some embodiments, as shown in FIG. 2E, the via 280 is arranged at a middle location between the gate 220 and the dummy gate 250, and the via 290 is arranged at a middle location between the gate 220 and the dummy gate 260. In other words, the distance D5 is about the same as the distance D6. Based on the above arrangements of the via 280 and the contact 230, the contact 230 is arranged with offset with respect to the via 280, as illustrated in FIG. 2E. Based on the above arrangements of the via 290 and the contact 240, the contact 240 is arranged with offset with respect to the via 290, as illustrated in FIG. 2E.

In some other embodiments of FIG. 2E, the distance D5 is greater than the distance D6. Based on the above arrangements of the via 280 and the contact 230, the contact 240 is arranged without offset with respect to the via 290. In some alternative embodiments of FIG. 2E, the distance D7 is greater than the distance D8. Based on the above arrangements of the via 290 and the contact 240, the contact 240 is arranged without offset with respect to the via 290.

Figure 3:
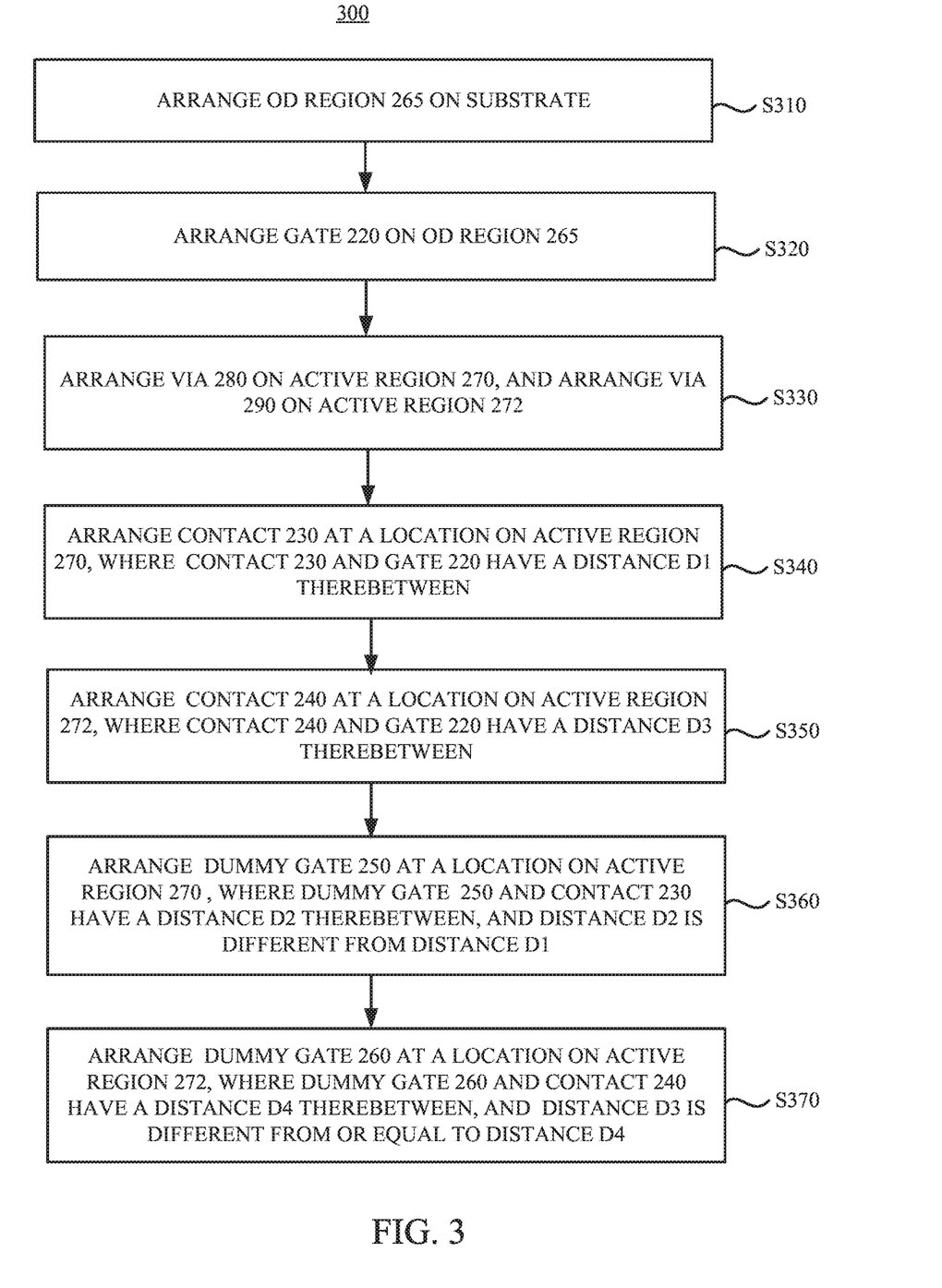
FIG. 3 is a flow chart of a method for the layout of the MOS device in FIG. 2A, in accordance with some embodiments of the present disclosure.

FIG. 3 is a flow chart of a method for the layout of the MOS device 200A in FIG. 2A, in accordance with some embodiments of the present disclosure. For ease of understanding, reference is now made to FIG. 2A, FIG. 2B, and FIG. 3, and the operations of the method 300 are described with the MOS device 200A in FIG. 2A and FIG. 2B for illustrative purposes. Layouts of various MOS devices employing the method 300 are within the contemplated scope of the present disclosure.

In operations 5310, the OD region 260, which includes the active region 270 and the active region 272, is arranged on the substrate (not shown) as discussed above. As described above, in various embodiments, the substrate is made of a semiconductor material, including, for example, silicon, SiC, SiGe, an III-V compound semiconductor, combinations thereof, or the like.

In operation 5320, the gate 220 is arranged on the OD region 265. In some embodiments, the gate 220 is formed of polysilicon. In some embodiments, the active regions 270 and 272 are formed by implanting n-type impurity into the semiconductor substrate. For example, when the MOS device 200A is an NMOS device, the active region 270 and the active region 272 are n-type doped regions. In some further embodiment, the n-type impurity includes phosphorous. In some other embodiments, the n-type impurity includes arsenic.

Alternatively, in some embodiments, the diffusion regions 272 and 274 are formed by implanting p-type impurity into the semiconductor substrate. For example, when the MOS device 200A is a PMOS device, the diffusion region 272 and the diffusion region 274 are p-type doped regions. In some embodiment, the p-type impurity includes boron. In some other embodiments, the p-type impurity includes indium.

The arrangements and implementations of the gate 220 and the active region 270, and the active region 272 are given for illustrative purposes. Various arrangements and implementations of the gate 220 and the active region 270, and the active region 272 are within the contemplated scoped of the present disclosure.

In operations 5330, the via 280 is arranged on the active region 270, and the via 290 is arranged on the active region 272. In some embodiments, the via 280 and the via 290 are formed by etching holes and subsequently filling the same by a conductive material.

The formation of the via 280 and the via 290 is given for illustrative purposes only. Various formations of the via 280 and the via 290 are within the contemplated scope of the present disclosure.

In operation 5340, the contact 230 is arranged at a location on the active region 270 in FIG. 2A, where the contact 230 and the gate 220 have a distance D1 therebetween. In operation 5350, the contact 240 is arranged at a location on the active region 272 in FIG. 2A, where the contact 240 and the gate 220 have a distance D3 therebetween. In some embodiments, the via 280 is coupled between the contact 230 and the active region 270, and the via 290 is coupled between the contact 240 and the active region 272.

In operation 5360, the dummy gate 250 is arranged at a location on the active region 270, where the contact 230, and the dummy gate 220 has a distance D2 therebetween, and the distance D2 is different from the distance D1. For illustration, as illustrated in FIG. 2A or FIG. 2E, the distance D1 is greater than the distance D2.

In operation 5370, the dummy gate 260 is arranged at a location on the active region 272, where the dummy gate 260 and the contact 240 have a distance D4 therebetween, and the distance D3 is different from or equal to the distance D4. As illustrated in FIG. 2A, the distance D3 is configured to be equal to the distance D4. In some alternative embodiments illustrated in FIG. 2C or FIG. 2D, the distance D3 is configured to be greater than the distance D4.

As described above, with the arrangements of the asymmetric distance D1 and the distance D2 and/or the asymmetric distance D3 and the distance D4, the capacitance C1, coupling between the gate 220 and the contact 230, and the capacitance C3, coupling between the gate 220 and the contact 240, are reduced. Accordingly, the timing impacts on the signals, which are processed and/or transmitted through the gate 220, and contacts 230 and 240, are reduced. As a result, the performance of the circuit utilizing the MOS devices 200A, and/or 200C-200E in FIGS. 2A-2E is able to be improved.

It is understood that for the embodiments shown above, additional operations are able to be performed to complete the fabrication of the MOS device 200A. For example, in some embodiments, these additional operations includes formation of interconnect structures (for example, lines and vias, metal layers, and interlayer dielectrics that provide electrical interconnection to the MOS device 200A), formation of passivation layers, and packaging of the MOS device 200A.

The above description of the method 300 includes exemplary operations, but the operations of the method 300 are not necessarily performed in the order described. The order of the operations of the method 300 disclosed in the present disclosure are able to be changed, or the operations are able to be executed simultaneously or partially simultaneously as appropriate, in accordance with the spirit and scope of various embodiments of the present disclosure.

In some embodiments, the semiconductor structure 100 in FIG. 1 is formed through a design tool, which is, for example, an auto place and route (APR) tool, carried on a non-transitory computer-readable medium storing the method 300. In other words, in some embodiments, the method 300 is able to be implemented in hardware, software, firmware, and the combination thereof.

As described above, the semiconductor structure 100 in FIG. 1, the MOS devices 200A, and 200C-200E in FIGS. 2A-2E, and the method 300 in FIG. 3 provided in the present disclosure are able to reduce the coupling capacitances between the gate and the contact, which are configured to process the electrical signals, in a semiconductor device. Accordingly, the timing impacts, including, for example, additional time delays, are able to be reduced. As a result, the performance of circuits employing such arrangements is improved.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a device is disclosed that includes gates and a first conductive segment. A first distance is present between a first gate of the gates and the first conductive segment. A second distance is present between a second gate of the gates and the first conductive segment. The first distance is greater than the second distance.

Also disclosed is a device that includes a first gate and a first conductive segment. The first conductive segment is arranged between a first gate and a first dummy gate corresponding to the first gate. A first distance between the first conductive segment and the first gate and a second distance between the first conductive segment and the first dummy gate are asymmetric.

Also disclosed is a method that includes the operation below. A first gate is arranged on an active region. A conductive segment is arranged on the active region, in which a first distance is present between the first gate and the conductive segment. A second gate is arranged on the active region, in which a second distance is present between the second gate and the conductive segment, in which the first distance is different from the second distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first gate and a second gate over a first active region;
    forming a first source/drain contact over the first active region, wherein the first source/drain contact is between, and spaced apart from, the first gate and the second gate, wherein the first source/drain contact is formed directly over and electrically coupled to a source/drain region in the first active region, wherein a first distance between the first gate and the first source/drain contact is different from a second distance between the second gate and the first source/drain contact; and
    forming a first via over the first source/drain contact, wherein a bottom of the first via contacting the first source/drain contact is formed off-center with respect to the first source/drain contact, wherein the bottom of the first via extends outside boundaries of the first source/drain contact, wherein a third distance between the first gate and the first via is different from the first distance, and a fourth distance between the second gate and the first via is different from the second distance.

2. The method of claim 1, wherein the second gate is a dummy gate.

3. The method of claim 2, wherein the second gate is formed over an edge of the first active region.

4. The method of claim 2, wherein the first distance is larger than the second distance.

5. The method of claim 4, wherein the third distance is equal to the fourth distance.

6. The method of claim 1, wherein an upper surface of the first source/drain contact distal from the source/drain region extends further from the source/drain region than an upper surface of the first gate distal from the source/drain region.

7. The method of claim 6, wherein a first sidewall of the first via closest to the first gate is closer to the first gate than a second sidewall of the first source/drain contact closest to the first gate.

8. The method of claim 1, further comprising:
    forming a third gate and a second source/drain contact over a second active region, wherein the second active region and the first active region are disposed on opposing sides of the first gate, wherein the second source/drain contact is formed between the first gate and the third gate, wherein a fifth distance between the first gate and the second source/drain contact is equal to or larger than a sixth distance between the second source/drain contact and the third gate; and forming a second via over and contacting the second source/drain contact.

9. The method of claim 8, wherein a seventh distance between the first gate and the second via is equal to an eighth distance between the third gate and the second via.

10. The method of claim 9, wherein the fifth distance is larger than the sixth distance, and the second via is formed off-center with respect to the second source/drain contact.

11. The method of claim 8, wherein a seventh distance between the first gate and the second via is larger than an eighth distance between the third gate and the second via.

12. The method of claim 8, wherein the third gate is a dummy gate.

13. A method comprising:
forming a first gate over an active region of a substrate;
forming a dummy gate over the active region;
forming a source/drain contact between the first gate and the dummy gate and over a source/drain region in the active region, wherein the source/drain contact is formed to be electrically coupled to the source/drain region; and
forming a via over the source/drain contact, wherein a lower surface of the via contacting the source/drain contact is off-center with respect to the source/drain contact, wherein the lower surface of the via extends beyond sidewalls of the source/drain contact, wherein a first distance between the first gate and the source/drain contact is larger than a second distance between the dummy gate and the source/drain contact, wherein a third distance between the first gate and the via is larger than or equal to a fourth distance between the dummy gate and the via.

14. The method of claim 13, wherein the source/drain contact extends further from the source/drain region than the first gate and the dummy gate.

15. The method of claim 13, wherein the third distance is smaller than the first distance.

16. The method of claim 13, wherein the fourth distance is larger than the second distance.

17. A device comprising:
a substrate having an active region;
a first gate and a second gate over the active region;
a source/drain region in the active region between the first gate and the second gate;
a source/drain contact between and separated from the first gate and the second gate, wherein the source/drain contact is over and electrically coupled to the source/drain region, wherein a first distance between the first gate and the source/drain contact is different from a second distance between the second gate and the source/drain contact; and
a via over and contacting the source/drain contact, wherein a bottom of the via contacting the source/drain contact is off-center with respect to the source/drain contact such that a portion of the bottom of the via is disposed beyond lateral extents of the source/drain contact, wherein a third distance between the first gate and the via is different from the first distance, and wherein a fourth distance between the second gate and the via is different from the second distance.

18. The device of claim 17, wherein the first distance is larger than the second distance.

19. The device of claim 18, wherein the second gate is a dummy gate.

20. The device of claim 19, wherein the third distance is equal to or larger than the fourth distance.

\* \* \* \* \*